(12) United States Patent
Iketani (10) Patent No.: US 10,201,085 B2
(45) Date of Patent: Feb. 5, 2019

(54) METHODS OF FORMING BLIND VIAS FOR PRINTED CIRCUIT BOARDS

(71) Applicant: SANMINA CORPORATION, San Jose, CA (US)

(72) Inventor: Shinichi Iketani, San Jose, CA (US)

(73) Assignee: SANMINA CORPORATION, San Jose, CA (US)

( * ) Notice: Subject to any disclaimer, the term of this patent is extended or adjusted under 35 U.S.C. 154(b) by 0 days.

(21) Appl. No.: 15/928,042

(22) Filed: Mar. 21, 2018

(65) Prior Publication Data

US 2018/0279473 A1    Sep. 27, 2018

Related U.S. Application Data

(60) Provisional application No. 62/474,368, filed on Mar. 21, 2017.

(51) Int. Cl.
| | |
|---|---|
| *H05K 1/11* | (2006.01) |
| *H05K 3/02* | (2006.01) |
| *H05K 3/42* | (2006.01) |
| *H05K 3/00* | (2006.01) |

(Continued)

(52) U.S. Cl.
CPC ........... *H05K 1/115* (2013.01); *H05K 3/0047* (2013.01); *H05K 3/02* (2013.01); *H05K 3/06* (2013.01); *H05K 3/423* (2013.01); *H05K 3/428* (2013.01); *H05K 3/429* (2013.01); *H05K 3/4652* (2013.01);

(Continued)

(58) Field of Classification Search
CPC .......... H05K 3/02; H05K 3/022; H05K 3/027; H05K 3/04; H05K 3/06; H05K 3/061; H05K 3/062; H05K 3/064; H05K 3/065; H05K 3/067; H05K 3/068; H05K 3/07; H05K 1/115; H05K 1/116
See application file for complete search history.

(56) References Cited

U.S. PATENT DOCUMENTS

| | | | |
|---|---|---|---|
| 2005/0128672 A1 | 6/2005 | Tourne et al. | |
| 2006/0090933 A1 | 5/2006 | Wig et al. | |
| 2006/0180346 A1 | 8/2006 | Knight et al. | |

FOREIGN PATENT DOCUMENTS

| | | |
|---|---|---|
| CN | 105578748 A | 5/2016 |
| CN | 105722315 A | 6/2016 |
| EP | 3089562 A1 | 11/2016 |

OTHER PUBLICATIONS

PCT/US2018/023660. International Search Report & Written Opinion (dated Jul. 27, 2018).

*Primary Examiner* — Jeremy C Norris
(74) *Attorney, Agent, or Firm* — Loza & Loza, LLP; Julio M. Loza (57) ABSTRACT

A multilayer PCB having may include a first sub-composite core having a first core structure sandwiched between a first conductive layer and a second conductive layer, the first core structure including one or more dielectric and conductive layers. A first via hole extends at least partially through the first core structure, wherein an inner surface of the first via hole is plated with a conductive material along a first via segment electrically coupling the first conductive layer to an internal layer or trace within the first core structure. A second via segment extending between the second conductive layer and the internal layer or trace is devoid of the conductive material such that the first via hole is substantially stub free. A first dielectric layer is coupled to the second conductive layer. A second sub-composite core coupled to the first dielectric layer.

18 Claims, 7 Drawing Sheets

(51) Int. Cl.
*H05K 3/46* (2006.01)
*H05K 3/06* (2006.01)
(52) U.S. Cl.
CPC .............. *H05K 2201/09509* (2013.01); *H05K 2203/0723* (2013.01)

METHODS OF FORMING BLIND VIAS FOR PRINTED CIRCUIT BOARDS

CLAIM OF PRIORITY

The present Application for Patent claims priority to U.S. Provisional Application No. 62/474,368 filed Mar. 21, 2017, which are hereby expressly incorporated by reference.

FIELD

The present invention relates to printed circuit boards (PCBs), and more particularly, to methods of forming blind vias in a printed circuit board (PCB).

BACKGROUND

Consumers are increasingly demanding both faster and smaller electronic products. The use of PCBs has grown enormously as new electronic applications are marketed. A PCB is formed by laminating a plurality of conducting layers with one or more non-conducting layers. As the size of a PCB shrinks, the relative complexity of its electrical interconnections grows.

A via structure is traditionally used to allow signals to travel between layers of a PCB. The plated via structure is a plated hole within the PCB that acts as a medium for the transmission of an electrical signal. For example, an electrical signal may travel through a trace on one layer of the PCB, through the plated via structure's conductive material, and then into a second trace on a different layer of the PCB.

Some PCBs, such as backplanes and other thick-format printed circuit boards, can endure significant signal integrity (SI) disturbances or degradation as a result of unused portions of through-holes and vias that extend past their last connected layer. Known as "stubs," these unused via portions result in signal reflections, capacitance, inductance and impedance discontinuities, and signal losses, all of which may have a negative impact on signal integrity as signal propagation speeds increase.

Such stubs may be avoided by forming blind vias or blind plated holes (BPH).

Figure 1:
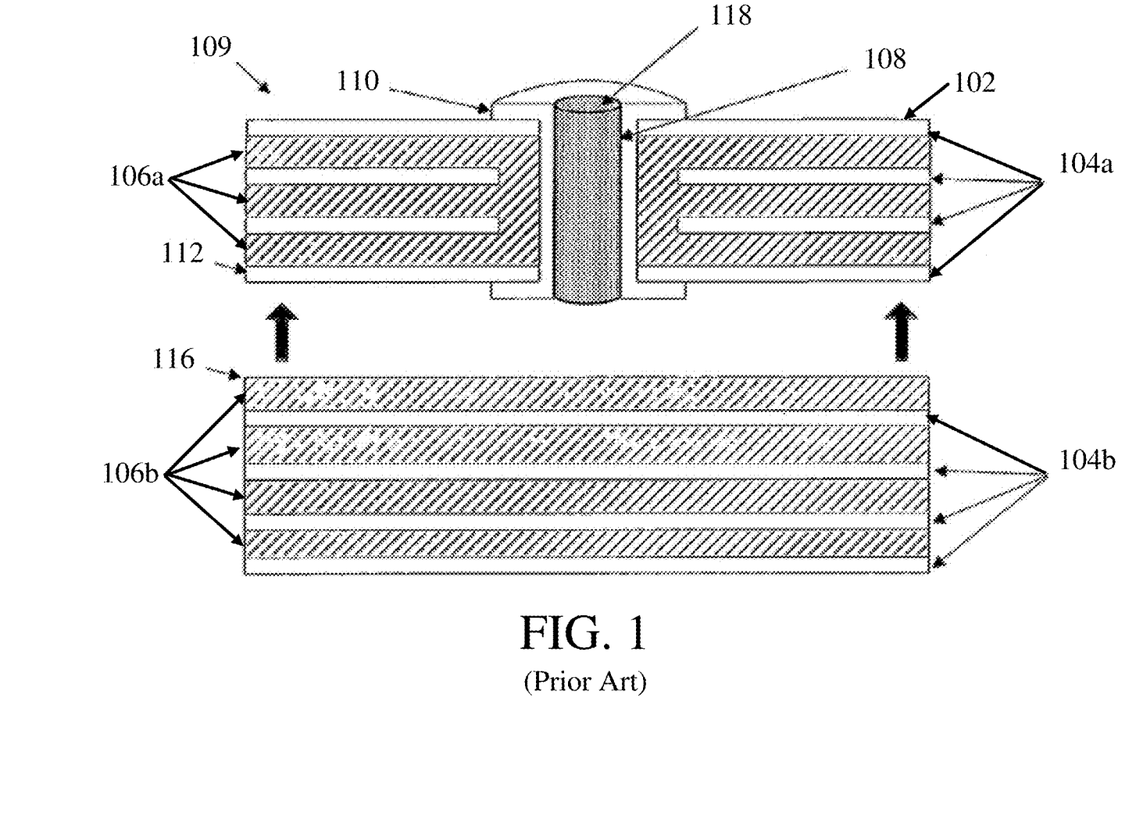
FIG. 1 illustrates a prior art approach for creating a blind plated hole.

FIG. 1 illustrates a prior art approach for creating a blind plated hole. A sub-composite structure 109 comprises conductive layers 104a and 104b and dielectric layers 106a and 106b. A via hole 108 is drilled through the sub-composite structure 109, extending from a first surface 102 of the sub-composite structure 109 through a first conductive layer 112. The via hole 108 is plated with a conductive material 110, after which the via hole 108 is filled with a medium 118. After the via hole 108 is filled with the medium 118, one or more additional cores that make up the PCB, such as laminate 116, is added to sub-composite structure 109. Note that the medium 118 may serve to keep the hole 108 from otherwise filling with prepreg material when the laminate 116 is added to the sub-composite structure 109.

Figure 2:
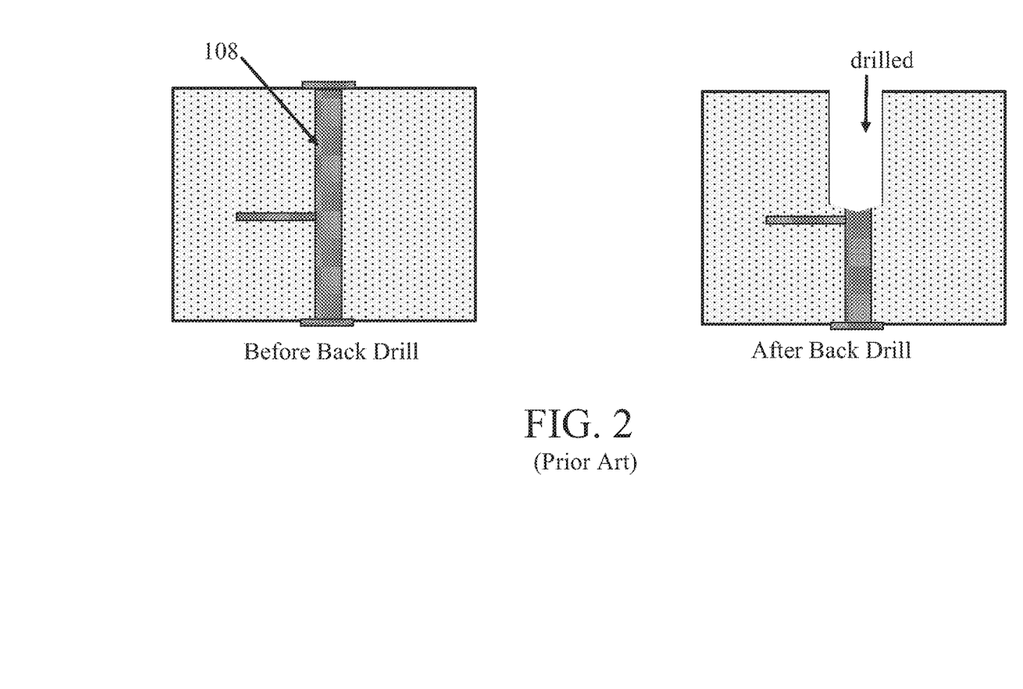
FIG. 2 illustrates the via hole of FIG. 1 before and after backdrilling, and after the laminate is added to the sub-composite structure.

FIG. 2 illustrates the via hole 108 of FIG. 1 before and after backdrilling, and after the laminate 116 is added to the sub-composite structure 109. A part of the plated hole 108 (e.g., also referred to as a stub) is drilled out using a controlled depth drill with a larger drill bit diameter than the via hole 108. However, du has difficulty for the depth control when the PCB gets thicker format.

Figure 3:
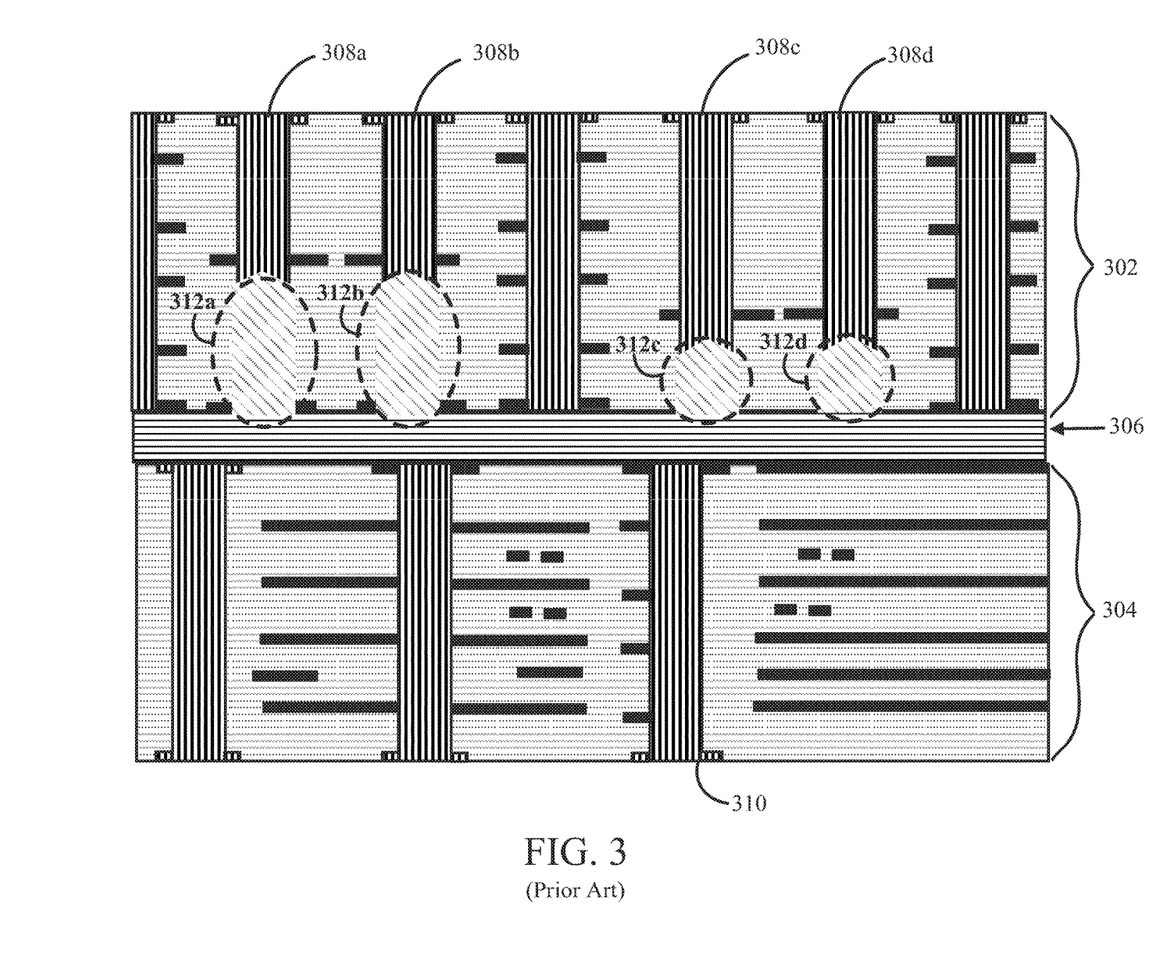
FIG. 3 illustrates a conventional high density interconnect PCB.

FIG. 3 illustrates a conventional high density interconnect PCB. The PCB 300 may be formed by separately forming two sub-assembly cores 302 and 304 and applying thicker than normal plating to through holes to form a plurality of vias 308 and 310. Those vias 308a, 308b, 308c, and 308d are back drilled to minimize stubs. The two sub-assembly cores 302 and 304 are then laminated together with enough prepreg 306 to fill via holes 308 and/or voids 312 left behind after drilling out the stubs. The external/exposed surfaces of the sub-assembly cores 302 and 304 may then be cleaned (scribed) to remove steeped resin. The sub-assembly cores 302 and 304 may then be drilled from their external/exposed surfaces to make plated blind holes.

However, this approach in FIG. 3 requires copper plating of the via holes that is sufficiently thick for subsequent drilling, which requires a longer plating time, limits the minimum dielectric/prepreg 306 thickness for the final assembly to deliver enough resin/prepreg to fill the holes 308a, 308b, 308c, and 308d, requires higher drill position accuracy, and potentially limits the achievable thickness range for the PCB 300 (e.g., it makes it more difficult to make thinner PCBs).

Therefore, a method is needed to efficiently form blind vias while reducing stub length and processing costs and difficulty.

SUMMARY

A first aspect provides a method for making a printed circuit board (PCB) having a blind plated through hole, comprising: (a) forming a first sub-composite core having a first core structure sandwiched between a first conductive layer and a second conductive layer, the first core structure including one or more dielectric layers and conductive layers; (b)

forming a first via hole through the first core structure; (c) plating an inner surface of the first via hole with a conductive material to form a first plated via hole, wherein the first plated via hole electrically couples the first conductive layer to an internal layer or trace within the first core structure; (d) filling the first plated via hole with a conductive ink; (e) backdrilling the first plated via hole along a segment between the second conductive layer and the internal layer or trace to form a first blind plated through hole, wherein such backdrilling removes both the conductive material and conductive ink along the segment; (f) laminating the second conductive layer of the first sub-composite core to a second sub-composite core; (g) backdrilling the first plated via hole along a second segment between the first conductive layer and a second trace, wherein such backdrilling removes both the conductive material and conductive ink along the second segment; (h) drilling a blind hole through the first plated via hole at least through the non-conductive ink or to the non-conductive ink; (i) filling the backdrilled segment with a non-conductive ink prior to laminating; and/or (j) etching the second conductive layer to form traces prior to laminating.

In some implementations, the second sub-composite core may be formed from a second core structure sandwiched between a third conductive layer and a fourth conductive layer, the second core structure including one or more dielectric layers and conductive layers. The second conductive layer of the first sub-composite core may be laminated to the fourth conductive layer of the second sub-composite core. The method may further comprise: (k) forming a second via hole through the second core structure; (l) plating an inner surface of the second via hole with a conductive material to form a second plated via hole, wherein the second plated via hole electrically couples the third conductive layer to an internal layer or trace within the second core structure; (m) filling the second plated via hole with a conductive ink; (n) backdrilling the second plated via hole along a segment between the fourth conductive layer and the internal layer or trace, wherein such backdrilling removes both the conductive material and conductive ink along the segment; and/or (o) drilling a blind hole through the second plated via hole at least through non-conductive ink or to the non-conductive ink. In some examples, the third conductive layer may be etched to form traces prior to lamination.

Another aspect provides a printed circuit board (PCB) having a blind plated through hole, the PCB manufactured by a method comprising: (a) forming a first sub-composite core having a first core structure sandwiched between a first conductive layer and a second conductive layer, the first core structure including one or more dielectric layers and conductive layers; (b) forming a first via hole through the first core structure; (c) plating an inner surface of the first via hole with a conductive material to form a first plated via hole, wherein the first plated via hole electrically couples the first conductive layer to an internal layer or trace within the first core structure; (d) filling the first plated via hole with a conductive ink; (e) backdrilling the first plated via hole along a segment between the second conductive layer and the internal layer or trace to form a first blind plated through hole, wherein such backdrilling removes both the conductive material and conductive ink along the segment; (f) laminating the second conductive layer of the first sub-composite core to a second sub-composite core; (g) drilling a blind hole through the first plated via hole at least through the non-conductive ink or to the non-conductive ink; (h) filling the backdrilled segment with a non-conductive ink prior to laminating; and/or (i) etching the second conductive layer to form traces prior to laminating. The second sub-composite core may be formed from a second core structure sandwiched between a third conductive layer and a fourth conductive layer, the second core structure including one or more dielectric layers and conductive layers.

A third aspect provides a method for manufacturing blind plated hole (BPH) in a printed circuit board (PCB), the method comprising: (a) forming a sub-composite structure having a plurality of layers including an external layer and an inner layer; (b) forming a via hole, associated with the blind plated hole, that passes through the sub-composite structure, the via hole being open at both ends and extending from the external layer through the inner layer; (c) plating a layer of conductive material on walls of the via hole; (d) filling the plated via hole with a conductive compound; (e) drilling out unnecessary portions of the blind plated hole from the inner layer to an intermediate layer within the sub-composite structure to remove a stub along the plated via hole; (f) laminating the sub-composite structure to another sub-composite structure. The blind plated hole may extend from the external layer to the intermediate layer.

A fourth aspect provides a printed circuit board (PCB), comprising: (a) a first sub-composite core having a first core structure sandwiched between a first conductive layer and a second conductive layer, the first core structure including one or more dielectric layers and conductive layers; (b) a first via hole through the first core structure, wherein an inner surface of the first via hole is plated with a conductive material along a first via segment electrically coupling the first conductive layer to an internal layer or trace within the first core structure, while a second via segment between the second conductive layer and the internal layer or trace is devoid of the conductive material such that the first via hole is stub free; (c) a first dielectric layer coupled to the second conductive layer; and/or (d) a second sub-composite core having a second core structure sandwiched between a third conductive layer and a fourth conductive layer, the second sub-composite core coupled to the first dielectric layer. The first conductive layer may also be internal to the first sub-composite structure. In one example, a stub may be a plated portion within the first via hole that is not coupled to a layer or trace at both ends.

BRIEF DESCRIPTION OF THE DRAWINGS

FIG. 6 (comprising FIGS. 6A and 6B) illustrates a method for forming a PCB with blind plated holes/vias while eliminating/minimizing stubs.

DETAILED DESCRIPTION OF THE INVENTION

Methods are provided for forming blind plated holes/vias in multi-layer printed circuit board. A multilayer PCB can be a chip substrate, a motherboard, a backplane, midplane, a flex or rigid flex circuit. A blind plated hole or via may be a structure that is used for transmitting electrical signals from one conductive layer to another conductive layer of a multilayer PCB, but such blind plated hole or via may not traverse through the full thickness of the fully assembled multiplayer PCB (i.e., one or both ends of the blind plated hole or via may terminate within an internal portion or layer of the PCB). Such blind plated hole/via may also be a component mounting hole for electrically connecting an electrical component to other electrical components on the PCB.

According to one aspect, a method is disclosed for forming blind plated holes or vias in a way that eliminates or minimizes stubs (or stub lengths) and avoids other shortcomings of the prior art methods.

Figure 4:
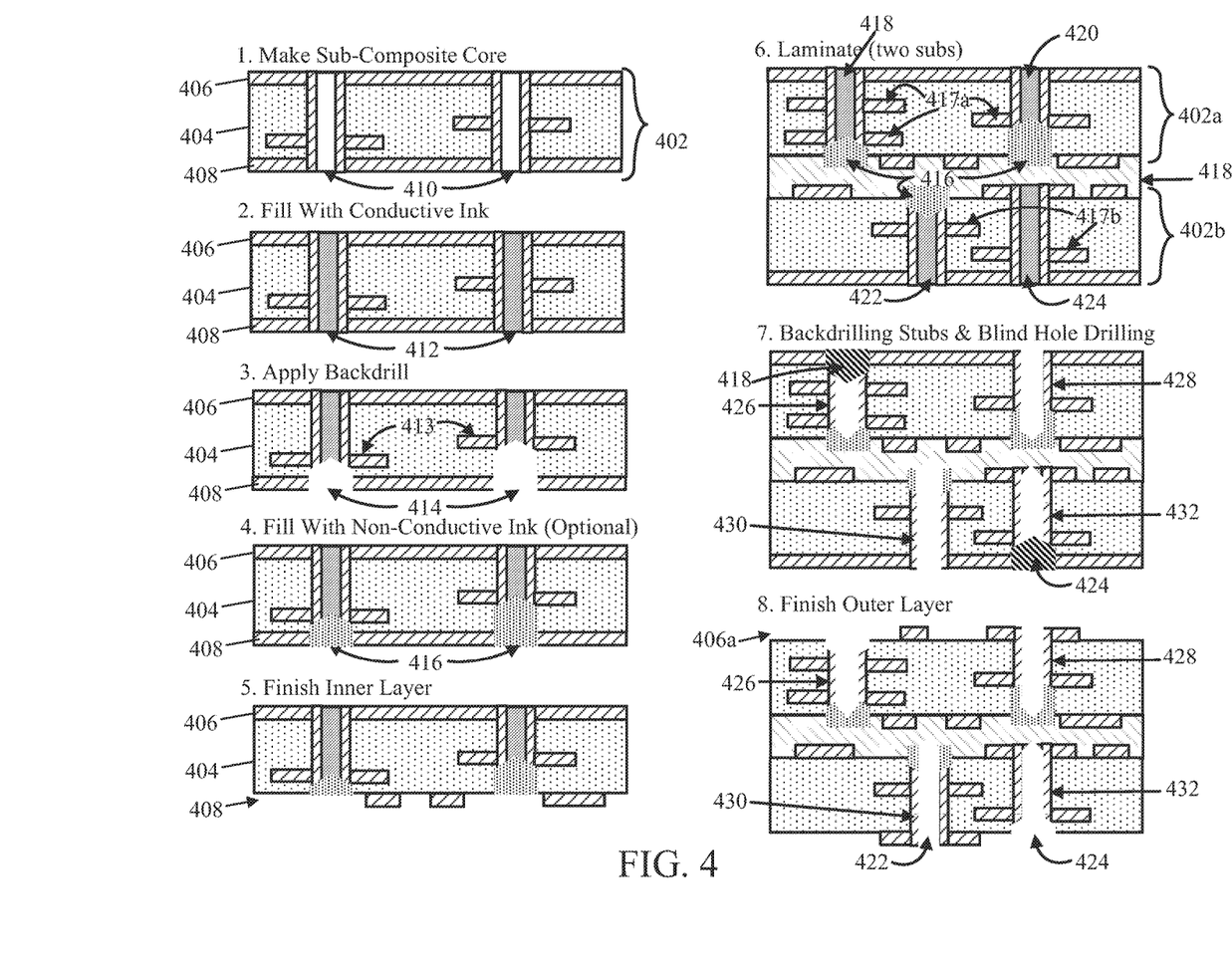
FIG. 4 illustrates a method for forming PCBs with blind plated holes/vias.

FIG. 4 illustrates a method for forming PCBs with blind plated holes or vias. At Step 1, a sub-composite core/structure 402 is formed, including a dielectric layer 404 and conductive layers 406 and 408 on either side. Generally, a sub-composite core 402 may include one or more conductive and dielectric layers. One or more holes or vias 410 may be formed and plated through the sub-composite core 402.

At Step 2, the holes or vias 410 are filled with a conductive ink 412. At Step 3, one side (e.g., a first side) of the holes or vias 410 (i.e., the side that will be laminated) is backdrilled to form backdrilled holes or vias 414. The backdrilled holes 414 may be larger in diameter than the plated holes 410 (i.e., to remove plating from the drilled segment). The depth of the backdrilled holes 414 may be dictated by the internal interconnects/traces 413 to which each plated hole/via couples. Such backdrilling serves to remove stubs, or portions of the plated hole or vias, that are not needed for signal transmission. Consequently, the plated holes or vias 410 may be backdrilled to the depth of the internal interconnect/trace 413 so that the part of plated hole/via (i.e., the stub) is no longer than it needs to be.

At Step 4, the voids 414 of backdrilled holes or vias 410 may be optionally filled with non-conductive ink 416. At Step 5, a conductive layer 408 may be etched or finished (i.e., the conductive layer onto which another sub-composite core is to be laminated). Note that in an alternative implementation, if/when optional step 4 is skipped, then Step 3 and Step 5 may be reversed (i.e., the conductive layer 408 may be etched or finished, to add conductive paths, and then the plated holes or vias 410 may be backdrilled).

At Step 6, two sub-composite cores 402a and 402b may be laminated together using a layer of prepreg 418 in between. Note that the two sub-composite cores 402a and 402b may be formed and/or processed by a method similar to that described/illustrated in steps 1-5 to remove stubs from platted holes and vias from a first side to be laminated. The sub-composite structures 402a and 402b may include one or more internal interconnects/traces 417a and 417b through which plated via holes 418, 420, 422, and 424 pass.

At Step 7, blind holes are first formed (e.g., drilled), then a backdrill process is applied to a first via hole 418 and a second via hole 424 to remove a stub outer layer side as necessary and leaves a first and second blind plated hole segments 426 and 432, respectively, without stubs. In an alternative approach, the backdrill process is applied to the first via hole 418 and the second via hole 424 to remove the stub outer layer side as necessary, then the blind holes are formed (e.g., drilled), leaving the first and second blind plated hole segments 426 and 432, respectively, without stubs. Note that the first and second blind plated hole segments 426 and 432 are completely internal to the multilayer PCB (formed by sub-composite structures 402a and 402b) as neither end of the conductive/plated portion of the hole/via reaches an external surface of the multilayer PCB. In this manner, blind hole or via stubs may be eliminated or minimized so as to improve signal integrity through blind holes in PCBs. The via holes 418, 420, 422, and 424 may be further drilled (e.g., blind via drilling) to remove fill material from the plated through holes. For instance, such blind via drilling may be done to a depth that removes or reaches at least a portion of the non-conductive ink 416 that may be filling the plated holes or vias.

At Step 8, the outer conductive layers 406a and 406b may be etched to form traces thereon. In some implementations, the stub(s) may be backdrilled at this step 8, if it is skipped at step 7, to remove the stubs.

Figure 5:
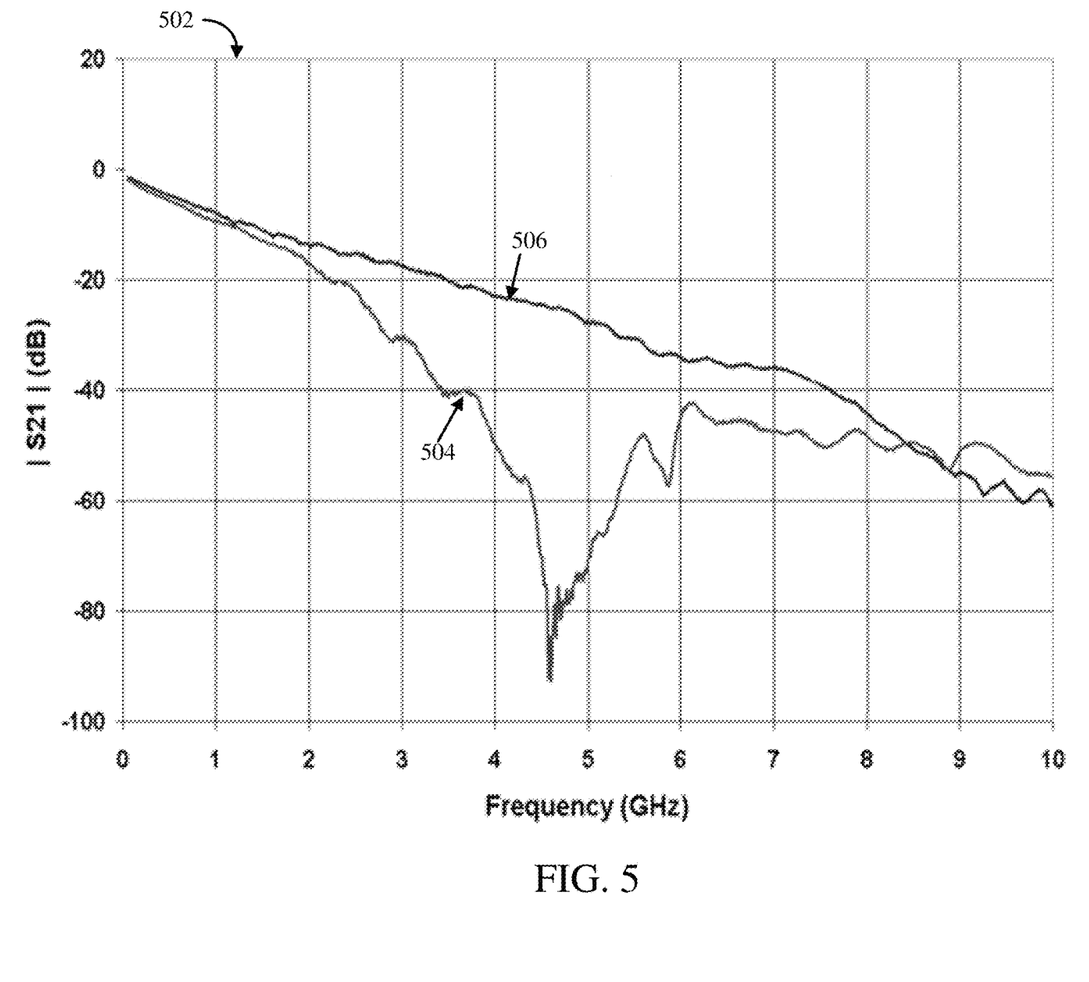
FIG. 5 illustrates an exemplary signal response graph for a blind plated hole/via with and without a stub.

FIG. 5 illustrates an exemplary signal response graph 502 for a blind plated hole/via with and without a stub. A first signal response 504 shows the signal deterioration within a blind plated hole/via at certain frequencies due to the stub within such plated hole/via. A second signal response 506 shows a more linear response and lower loss without resonance (e.g., especially in the 2 GHz to 8.5 GHz range) due to a blind plated hole/via with no stub (or a reduced/minimized stub). In this example, a significant improvement in signal integrity is noticed between 2 GHz and 8 GHz. That is, the signal response is substantially linear between approximately 2 GHz and 8 GHz.

Backdrilling the blind plated hole/via results in: (a) less signal attenuation loss due to minimized resonance by stub, (b) increased channel bandwidth, (c) reduced EMI/EMC radiation from the stub end, (d) reduced parasitic inductance and capacitance due to the stub, and/or (e) reduced via-to-via crosstalk.

Figure 6A:
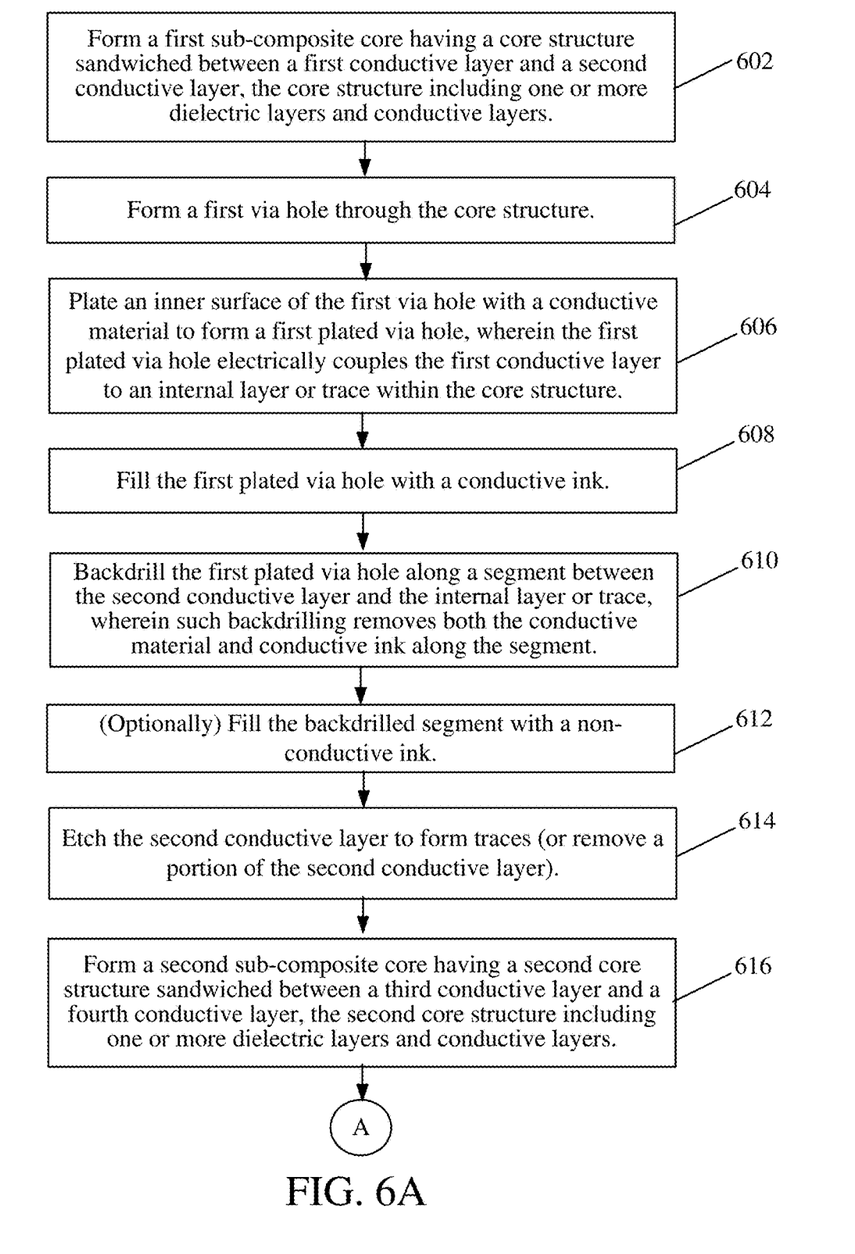
Figure 6B:
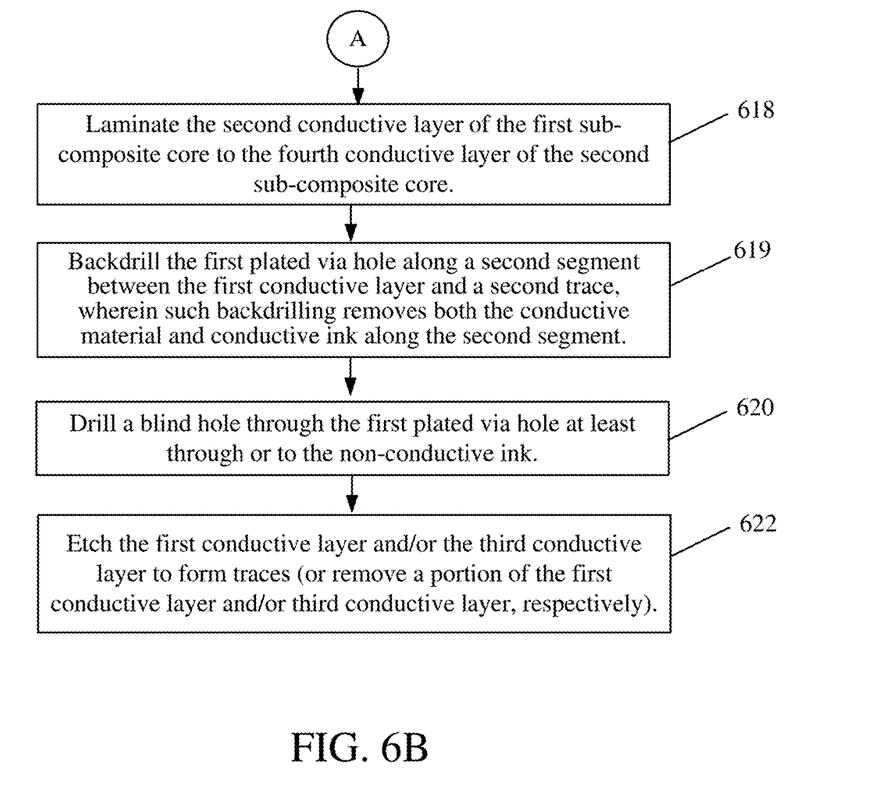

FIG. 6 illustrates a method for forming a PCB with blind plated holes/vias while eliminating/minimizing stubs. A first sub-composite core is formed having a core structure sandwiched between a first conductive layer and a second conductive layer, the core structure including one or more dielectric layers and conductive layers 602. A first via hole is formed (e.g., drilled) through the core structure 604. An inner surface of the first via hole is then plated (e.g., electro plating) with a conductive material to form a plated via hole, wherein the plated via hole electrically couples the first conductive layer to an internal layer or trace within the core structure 606. The plated via hole may then be filled with a conductive ink 608.

The plated via hole is backdrilled along a segment between the second conductive layer and the internal layer or trace, wherein such backdrilling removes both the conductive material and conductive ink along the segment 610. The backdrilling along the segment may remove plating and conductive ink along the first via hole from the second conductive layer to the internal layer or trace within the core structure. In this manner, any via stub in the plated via hole is removed. The backdrilled segment is (optionally) filled with a non-conductive ink 612. The second conductive layer may be etched/imaged to form traces (or remove a portion of the second conductive layer) 614.

A second sub-composite core may be similarly formed having a second core structure sandwiched between a third conductive layer and a fourth conductive layer, the second core structure including one or more dielectric layers and conductive layers 616. Like the first sub-composite core, the second sub-composite core may include a second plated via hole.

The second conductive layer of the first sub-composite core may be laminated to the fourth conductive layer of the second sub-composite core (e.g., by employing a prepreg layer in between) 618.

In some instances, the first plated via hole may be backdrilled along a second segment between the first conductive layer and a second trace, wherein such backdrilling removes both the conductive material and conductive ink along the second segment 619. For instance, this may be done when an internal blind plated hole segment 426 (FIG. 4) is desired.

A blind hole may be drilled through the first plated via hole at least through or to the non-conductive ink 620. Note that other blind holes may be formed on the first sub-composite core and second sub-composite core.

In alternative implementations, steps 619 and 620 may be reversed, with blind hold drilling occurring first, and followed by backdrilling.

The outer layer side backdrill may be applied between process steps 618 and 620, between process steps 620 and 622, or after process step 622.

The first conductive layer and/or the third conductive layer may be etched/imaged to form traces (or remove a portion of the first conductive layer and/or third conductive layer, respectively) 622.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A printed circuit board (PCB) having a blind plated through hole, the PCB manufactured by a method comprising:

forming a first sub-composite core having a first core structure sandwiched between a first conductive layer and a second conductive layer, the first core structure including one or more dielectric layers and conductive layers;

forming a first via hole through the first core structure;

plating an inner surface of the first via hole with a conductive material to form a first plated via hole, wherein the first plated via hole electrically couples the first conductive layer to an internal layer or trace within the first core structure;

filling the first plated via hole with a conductive ink;

backdrilling the first plated via hole along a segment between the second conductive layer and the internal layer or trace to form a first blind plated through hole, wherein such backdrilling removes both the conductive material and conductive ink along the segment; and laminating the second conductive layer of the first sub-composite core to a second sub-composite core.

2. The printed circuit board of claim 1, wherein the PCB is manufactured by a method further comprising:
drilling a blind hole through the first plated via hole at least through the non-conductive ink or to the non-conductive ink.

3. The printed circuit board of claim 1, wherein the PCB is manufactured by a method further comprising:
filling the backdrilled segment with a non-conductive ink prior to laminating.

4. The printed circuit board of claim 1, wherein the PCB is manufactured by a method further comprising:
etching the second conductive layer to form traces prior to laminating.

5. The printed circuit board of claim 1, wherein the second sub-composite core is formed from a second core structure sandwiched between a third conductive layer and a fourth conductive layer, the second core structure including one or more dielectric layers and conductive layers.

6. A printed circuit board (PCB), comprising:
a first sub-composite core having a first core structure sandwiched between a first conductive layer and a second conductive layer, the first core structure including one or more dielectric layers and conductive layers;
a first via hole through the first core structure, wherein an inner surface of the first via hole is plated with a conductive material along a first via segment electrically coupling the first conductive layer to an internal layer or trace within the first core structure, while a second via segment between the second conductive layer and the internal layer or trace is devoid of the conductive material such that the first via hole is stub free;
a first dielectric layer coupled to the second conductive layer; and
a second sub-composite core having a second core structure sandwiched between a third conductive layer and a fourth conductive layer, the second sub-composite core coupled to the first dielectric layer.

7. The printed circuit board of claim 6, wherein the first conductive layer is also internal to the first sub-composite structure.

8. The printed circuit board of claim 6, wherein a stub is a plated portion within the first via hole that is not coupled to a conductive layer or trace at both ends.

9. A method for making a printed circuit board (PCB) having a blind plated through hole, comprising:
forming a first sub-composite core having a first core structure sandwiched between a first conductive layer and a second conductive layer, the first core structure including one or more dielectric layers and conductive layers;

forming a first via hole through the first core structure;

plating an inner surface of the first via hole with a conductive material to form a first plated via hole, wherein the first plated via hole electrically couples the first conductive layer to an internal layer or trace within the first core structure;

filling the first plated via hole with a conductive ink;

backdrilling the first plated via hole along a segment between the second conductive layer and the internal layer or trace to form a first blind plated through hole, wherein such backdrilling removes both the conductive material and conductive ink along the segment; and laminating the second conductive layer of the first sub-composite core to a second sub-composite core.

10. The method of claim 9, further comprising:
backdrilling the first plated via hole along a second segment between the first conductive layer and a second trace, wherein such backdrilling removes both the conductive material and conductive ink along the second segment.

11. The method of claim 9, further comprising:
drilling a blind hole through the first plated via hole at least through the non-conductive ink or to the non-conductive ink.

12. The method of claim 9, further comprising:
filling the backdrilled segment with a non-conductive ink prior to laminating.

13. The method of claim 9, further comprising:
etching the second conductive layer to form traces prior to laminating.

14. The method of claim 9, wherein the second sub-composite core is formed from a second core structure sandwiched between a third conductive layer and a fourth conductive layer, the second core structure including one or more dielectric layers and conductive layers.

15. The method of claim 14, wherein the second conductive layer of the first sub-composite core is laminated to the fourth conductive layer of the second sub-composite core.

16. The method of claim 14, further comprising
forming a second via hole through the second core structure;
plating an inner surface of the second via hole with a conductive material to form a second plated via hole, wherein the second plated via hole electrically couples the third conductive layer to an internal layer or trace within the second core structure;
filling the second plated via hole with a conductive ink;
backdrilling the second plated via hole along a segment between the fourth conductive layer and the internal layer or trace, wherein such backdrilling removes both the conductive material and conductive ink along the segment.

17. The method of claim 16, further comprising:
drilling a blind hole through the second plated via hole at least through non-conductive ink or to the non-conductive ink.

18. The method of claim 14, further comprising:
etching the third conductive layer to form traces prior to lamination.

* * * * *